(12) United States Patent
Lee et al.

(10) Patent No.: US 7,787,301 B2
(45) Date of Patent: Aug. 31, 2010

(54) FLASH MEMORY DEVICE USING DOUBLE PATTERNING TECHNOLOGY AND METHOD OF MANUFACTURING THE SAME

(75) Inventors: Doo-youl Lee, Seongnam-si (KR); Han-ku Cho, Seongnam-si (KR); Suk-joo Lee, Yongin-si (KR); Gi-sung Yeo, Seoul (KR); Cha-won Koh, Yongin-si (KR); Pan-suk Kwak, Hwanseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 763 days.

(21) Appl. No.: 11/590,207

(22) Filed: Oct. 31, 2006

(65) Prior Publication Data

US 2008/0067550 A1 Mar. 20, 2008

(30) Foreign Application Priority Data

Sep. 20, 2006 (KR) .................... 10-2006-0091346

(51) Int. Cl.
*G11C 16/06* (2006.01)
(52) U.S. Cl. ............................ 365/185.17; 365/185.33; 438/258; 438/725
(58) Field of Classification Search ............ 365/185.17, 365/185.33; 438/258, 725
See application file for complete search history.

(56) References Cited

U.S. PATENT DOCUMENTS

| 6,942,732 B2* | 9/2005 | Lin ............................ 117/97 |
| 2002/0098651 A1* | 7/2002 | Yim et al. .................... 438/258 |
| 2006/0234165 A1* | 10/2006 | Kamigaki et al. ............ 430/313 |
| 2008/0013377 A1* | 1/2008 | Sel et al. ................. 365/185.17 |

FOREIGN PATENT DOCUMENTS

| JP | 2004127346 | 4/2004 |
| JP | 2005-056889 | 3/2005 |
| KR | 2000-0035673 | 6/2000 |
| KR | 20050075634 | 7/2005 |
| KR | 20060060528 | 6/2006 |

OTHER PUBLICATIONS

English Abstract of Publication No. 2004-127346.
English Abstract of Publication No. 1020050075634.
English Abstract of Publication No. 10-2006-0060528.
English Abstract Publication No. 1020000035673.
English Abstract Publication No. 2005-056889.

* cited by examiner

*Primary Examiner*—Vu A Le
*Assistant Examiner*—Han Yang
(74) *Attorney, Agent, or Firm*—F. Chau & Associates, LLC

(57) ABSTRACT

Provided are a flash memory device and a method of manufacturing the same. The flash memory device includes strings. Each of the strings has a string selection line, a ground selection line, and an odd number of word lines formed between the string selection line and the ground selection line.

12 Claims, 12 Drawing Sheets

FLASH MEMORY DEVICE USING DOUBLE PATTERNING TECHNOLOGY AND METHOD OF MANUFACTURING THE SAME

CROSS-REFERENCE TO RELATED APPLICATION

This application claims priority to Korean Patent Application No. 10-2006-0091346 filed on Sep. 20, 2006 in the Korean Intellectual Property Office, the disclosure of which is incorporated herein by reference in its entirety.

BACKGROUND OF THE INVENTION

1. Technical Field

The present invention relates to a flash memory device and more particularly, to a flash memory device using double patterning technology and a method of manufacturing the same.

2. Discussion of the Related Art

In highly-integrated flash memory devices, it may be difficult to form fine patterns. For example, fine gates, each of which has a function of storing information, may increase the degree of integration of the flash memory device. Increasing the degree of integration of semiconductor devices, including a flash memory device, may be possible when a photolithography process of forming fine patterns is highly developed. Such a photolithography process may depend on such factors as the wavelength of light used, photolithography equipment, photoresist used for the photolithography process, and other various parameters. A technology for forming final patterns in such a way as to first form primary patterns and then form secondary patterns between the primary patterns has been recently researched. Such technology may be referred to as a double patterning technology.

In double patterning technology, the primary patterns may first be formed and then the secondary patterns may be formed between the primary patterns, so that the number of final patterns is odd. Where a semiconductor device with an even number of final patterns is formed using the double patterning technology, an unnecessary pattern may be formed in an end portion. A process of removing the unnecessary pattern may then be added. Further, another pattern may be formed in the region from which the unnecessary pattern was removed, so that the region may remain as a dead space. Generally, in semiconductor devices not using double patterning technology, all of the patterns may be formed in pairs and thus the number of final patterns may generally be even.

SUMMARY OF THE INVENTION

Embodiments of the present invention may provide a flash memory device that includes strings formed using a double patterning technology.

Embodiments of the present invention may provide a method of manufacturing a flash memory device that includes strings formed using the double patterning technology.

Embodiments of the present invention may provide a flash memory device having strings, each of the strings including a string selection line, a ground selection line, and an odd number of word lines formed between the string selection line and the ground selection line.

In addition, a flash memory device may have strings, each of the strings may include a string selection line, a ground selection line, and an even number of word lines formed between the string selection line and the ground selection line, in which a distance between the string selection line and a word line adjacent to the string selection line may be greater than a distance between the word lines.

Embodiments of the present invention may provide a method of manufacturing a flash memory device. The method may include forming a conductive layer on a substrate. A hard mask layer may be formed on the conductive layer. A first material layer may be formed on the hard mask layer. Photoresist patterns may be formed on the first material layer. First material patterns, which may selectively expose the surface of the hard mask layer, through patterning using the photoresist patterns as an etching mask may be formed. The photoresist patterns may be removed. A second material layer may be formed on the first material patterns and the hard mask layer, the surface of which may be selectively exposed. A third material layer may be formed on the second material layer. Third material patterns, which may expose the upper surface of the second material layer existing between portions of the second material layer, through patterning, may be formed. The surfaces of the first material patterns, the third material patterns and the hard mask layer may be selectively exposed by vertically removing the second material layer, the upper portion of which is exposed, thus forming second material patterns remaining only under the third material patterns. Hard mask patterns may be formed through the patterning of the hard mask layer, the surface of which has been selectively exposed, using the first material patterns and the third material patterns as an etching mask The first material patterns, the second material patterns and the third material patterns may be removed. Conductive patterns may be formed through the patterning of the conductive layer using the hard mask patterns as an etching mask The hard mask patterns may be removed.

The conductive layer may include a string selection line, a ground selection line, and word lines formed between the string selection line and the ground selection line.

The width of each of the word lines may be formed to be the same as and/or greater than the distance between the word lines.

An odd number of word lines may be formed. A word line which is formed adjacent to the ground selection line, may not be involved in the storage of information, or two word lines, which are formed adjacent to the ground selection line, may not be involved in the storage of information.

The distance between the string selection line and a word line adjacent to the string selection line may be formed to be two times the distance between the word lines.

The distance between the ground selection line and a word line adjacent to the ground selection line may be formed to be two times the distance between the word lines.

After forming the conductive pattern, a portion of the string selection line adjacent to a word line may be trimmed.

After forming the first material patterns, the word line adjacent to the string selection line or the ground selection line may be removed.

The first material layer and the third material layer may be comprised of silicon, and the second material layer may be comprised of silicon oxide.

In addition, embodiments of the present invention may provide a method of manufacturing a flash memory device, the method may include forming first mask patterns for forming a string selection line, a ground selection line, and more than half of a plurality of word lines to be formed between the string selection line and the ground selection line. Second mask patterns for forming less than half of the plurality of word lines may be formed between the first mask patterns. The string selection line, the ground selection line and the word lines may be formed using the first mask patterns and the second mask patterns as a patterning mask.

The width of each of the word lines may be formed to be the same as the distance between the word lines. The number of word lines may be odd. There may be a number of first mask patterns that may be one greater than a number of patterns for forming word lines.

The distance between the string selection line and a word line adjacent to the string selection line may be formed to be two times the distance between the word lines. The distance between the ground selection line and a word line adjacent to the ground selection line may be formed to be two times the distance between the word lines.

The word lines may be even in number, and each of the first mask pattern and the second mask pattern may have an identical number of word line forming patterns.

Each of a distance between the string selection line and a word line adjacent to the string selection line and a distance between the ground selection line and a word line adjacent to the ground selection line may be formed to be two times the distance between the word lines.

BRIEF DESCRIPTION OF THE DRAWINGS

A more complete appreciation of the present disclosure will be more clearly understood from the following detailed description taken in conjunction with the accompanying drawings, in which.

DESCRIPTION OF THE PREFERRED EMBODIMENTS

Figure 1A:
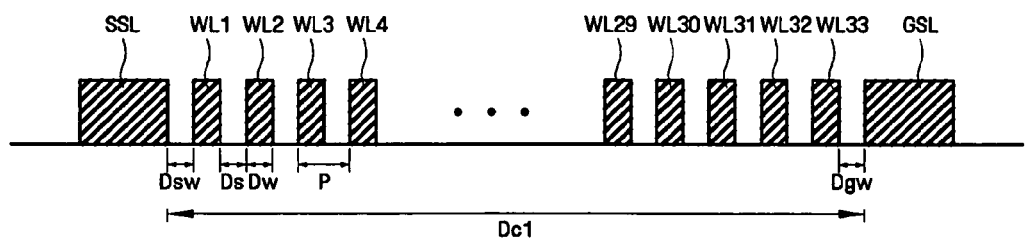
FIGS. 1A and 1B are schematic diagrams showing longitudinal sections of the unit string of a flash memory device according to first and second embodiments of the present invention.

Embodiments of the present invention will be described in detail in conjunction with the accompanying drawings. However, the present invention is not limited to the embodiments disclosed below, but may be implemented in various ways without departing from the spirit or scope of the present invention. The sizes and relative sizes of layers and regions shown in the accompanying drawings may be exaggerated for the clarity of description. The same reference numerals are used throughout the different drawings to designate the same or similar components. It should be understood that when an element such as a layer, film, region, or substrate is referred to as being "on" another element, it can be directly on the other element or intervening elements may also be present. In contrast, when an element is referred to as being "directly on" another element, there are no intervening elements present.

Embodiments described in the present specification may be described with reference to plan views and sectional views, which may be ideal schematic diagrams. Accordingly, the configurations of the illustrated drawings may be modified according to manufacturing technology and/or allowable error. The embodiments of the present invention are not limited to the specific configurations of the drawings, and may include variation in configurations depending on the manufacturing process. Regions shown in the drawings may have respective schematic attributions, and the shapes of the regions shown in the drawings are used to show examples the specific shapes of device regions having a specific form, but are not to be construed to limit the scope of the invention.

The unit string structures of various types of flash memory devices according to embodiments of the present invention and methods of forming the same are described with reference to the accompanying drawings below.

FIG. 1A is a schematic diagram showing a longitudinal section of the unit string of a flash memory device according to an embodiment of the present invention.

Referring to FIG. 1A, the unit string 100a of the flash memory device according to an embodiment of the present invention includes a string selection line SSL and a ground selection line GSL, which are formed on a substrate, and an odd number of word lines WLx formed between the string selection line SSL and the ground selection line GSL.

The substrate may be a semiconductor substrate, examples of suitable semiconductor substrates include: a silicon substrate, a silicon-germanium (SiGe) substrate, a silicon on insulator (SOI) substrate, a silicon on sapphire (SOS) substrate and other various types of semiconductor substrates well known in the art.

According to an embodiment, the substrate may be an active region. The inner portions of the regions of the substrate between the respective lines SSL, GSL and WLx may function as sources or drains. For example, although not shown, the inner portions of the substrate regions may be regions into which impurity ions have been injected, for example, to impart conductivity to the substrate.

The respective lines SSL, GSL and WLx may have a gate transistor structure. For example, the respective lines SSL, GSL and WLx may have a structure in which insulation layers are formed on the boundary surface of the substrate, and conductive layers may be respectively formed on the insulation layers. For example, the respective lines SSL, GSL and WLx may have a double gate structure in which the string selection line SSL and the ground selection line GSL may have a single gate electrode, and the word lines WLx may include control gates and floating gates.

The word lines WLx may form respective cells of a single flash memory device.

The number of word lines WLx between the string selection line SSL and ground selection line GSL, which constitute a string, may be odd. A single string in a typical flash memory device may be constructed using an even number of word lines. For example, 8, 16 or 32 word lines may constitute a single string. This is the standard of the flash memory device, and is set by taking the efficiency of information storage and the efficiency of input and output into account However, in the present embodiment, the string may be constructed using an odd number of word lines. For example, a word line WL33, which is not involved in the storage of information, as opposed to word lines WL1-WL32, which are involved in the storage of information, may be further included. For example, in the case where a word line is further included, the string of the present embodiment may include 33 word lines. In FIG. 1A, a 33rd word line WL33 adjacent to the ground selection line GSL need not be used to store information and may function to prevent coupling between a 32nd word line WL32 and the ground selection line GSL. Furthermore, although the 33rd word line WL33, which need not be involved in the storage of information, has been shown in the drawing as being adjacent to the ground selection line GSL, a word line WL1 adjacent to the string selection line SSL may, as an alternative, not be involved in the storage of information.

The number of word lines WLx may be odd, for example, because the word lines WLx are formed using the double patterning technology. Methods of forming a flash memory device using an odd number of word lines are described in detail below.

According to one embodiment, the width Dw of each of the word lines WLx and the distance Ds between the word lines WLx may be the same. According to another embodiment, the width Dw of each of the word lines WLx and the distance Ds between the word lines WLx may be different.

For example, the width Dw of each of the word lines WLx and the distance Ds between the word lines WLx may be set to 0.5 times the pitch P of the word lines WLx. The width Dw or the distance Ds may be applied to the distance Dsw between the string selection line SSL and a word line WL1 adjacent thereto and the distance Dgw between the ground selection line GSL and a word line WL33 adjacent thereto. For example, in the distances between the string selection line SSL, the word lines WLx and the ground selection line GSL may be set to be the same. The reason why the distances between the respective lines are set to be the same may be because the respective lines SSL, GSL and WLx are formed using the double patterning technology.

The distance Dc1 between the string selection line SSL and the ground selection line GSL may be set to 33.5 times the pitch P of the word lines WLx. For example, the distance Dc1 between the string selection line SSL and the ground selection line GSL may be set to a distance that is obtained by adding 0.5 pitch to a number of pitches corresponding to 'the number of word lines WL1-WL32 (which are involved in the storage of information)+1'. For example, where the number of word lines WL1-WL32 involved in the storage of information is 32, the distance Dc1 may be set to 33.5 pitches, obtained by adding 0.5 pitches to 33 pitches. If, for example, the number of word lines involved in the storage of information is 8, the distance Dc1 between the string selection line SSL and the ground selection line GSL may be set to 9.5 pitches. Furthermore, if the number of word lines is 16, the distance Dc1 may be set to 17.5 pitches.

Figure 1B:
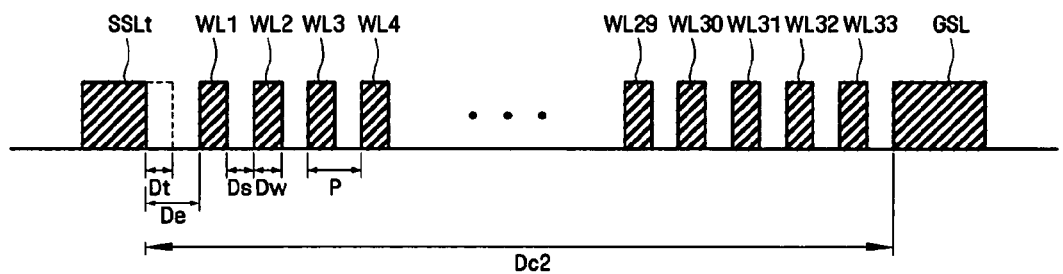

FIG. 1B is a schematic diagram of a longitudinal section showing the unit string structure of a flash memory device according to an embodiment of the present invention.

With reference to FIG. 1B, a string selection line SSLt may be obtained through trimming when compared with the string selection line SSL of FIG. 1A. Forming the string selection line SSLt may increase the distance between the string selection line SSL and a word line WL1 adjacent thereto by the distance Dt For example, the distance De between the string selection line SSLt and the word line WL1 adjacent thereto may be set to be greater than the distances Ds between subsequent word lines WL2-WL33. The extent of the trimming Dt of the string selection line SSLt may be set in various ways according to the operational characteristic of a corresponding device. The string selection line SSLt is illustrated as being trimmed by the distance Ds between the word lines WLx in order to promote understanding of the technical spirit of the present invention. The string selection line SSLt may be formed apart from the word line WL1 by a distance greater than the distances Ds between the word lines WLx. This is because an odd number of word lines WLx may be formed using the double patterning technology. This technology may be used to form a fine pattern. A final pattern may be obtained by combining primary patterns and secondary patterns, for example, by forming the primary pattern and then forming the secondary patterns between the primary patterns.

The distance Dc2 between the string selection line SSLt and the ground selection line GSL may be set to 34 times the pitch P of the word lines WLx. For example, the distance Dc2 between the string selection line SSLt and the ground selection line GSL may be set to a value obtained by adding 0.5 pitches and the trimming distance Dt to a number of pitches corresponding to 'the number of word lines WL1-WL32 (which are involved in the storage of information)+1'. In the case where the trimming distance Dt is 0.5 pitches is described by way of example, the distance Dc2 between the string selection line SSLt and the ground selection line GSL may be set to 34 times the pitch P of the word lines WLx.

Figure 2:
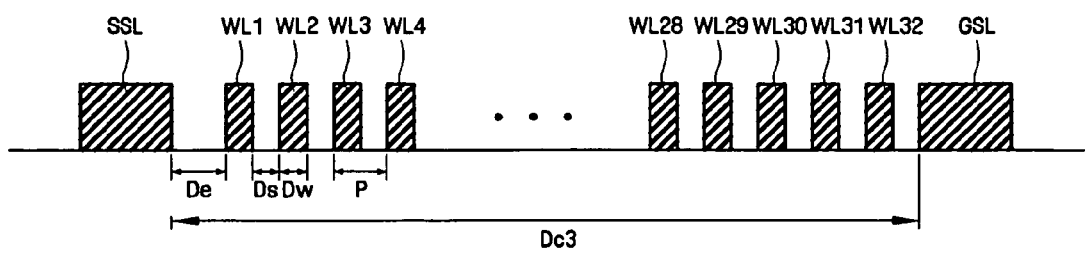
FIG. 2 is a schematic diagram showing a longitudinal section of the unit string of a flash memory device according to a third embodiment of the present invention.

FIG. 2 is a schematic diagram of a longitudinal section showing the unit string of a flash memory device according to another embodiment of the present invention.

Referring to FIG. 2, the unit string of the flash memory device according to an embodiment of the present invention may be constructed using an even number of word lines WLx formed between the string selection line SSL and the ground selection line GSL, in which the distance between the string selection line SSL and a word line WL1 adjacent thereto may be a wide distance De. The number of word lines WLx may be even, and all of the word lines WLx may be involved in the storage of information. The distance De between the string selection line SSL and the word line WL1 adjacent thereto may be greater than the distance Ds between other word lines WLx. For example, the distance De may be set to about two times the distance Ds. The number of the word lines WLx may be even and the distance De may be set to about two times the distance Ds because the respective lines SSL, GSL and WLx may also be formed using double patterning technology.

The distance Dc3 between the string selection line SSL and the ground selection line GSL may be set to 33 times the pitch P of the word lines WLx. For example, the distance Dc3 may be set to a value corresponding to 'the number of word lines WL1-WL32 (which ate involved in the storage of information)+1'. The distance Dc3 may be set to a distance that is obtained by adding the widened distance De to a number of pitches corresponding to the number of word lines WL1-WL32 involved in the storage of information. The widened distance De may be set to two times the distance Ds between the word lines WLx, that is, the pitch P of the word lines WLx, so that the distance Dc3 between the string selection line SSL and the ground selection line GSL may be set to 33 times the pitch P.

Figure 3A:
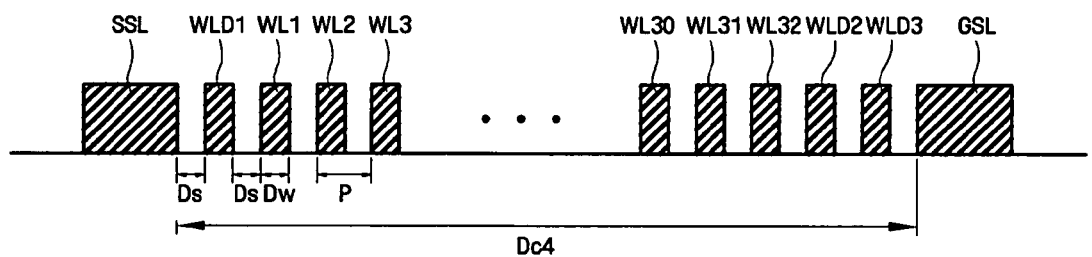
FIGS. 3A and 3B are schematic diagrams showing longitudinal sections of the unit string of a flash memory device according to fourth and fifth embodiments of the present invention.

FIG. 3A is a schematic diagram of a longitudinal section showing the unit string structure of a flash memory devices according to an embodiment of the present invention.

Referring to FIG. 3A, the unit string 300a of the flash memory device may include an odd number of word lines WLx and WLDx forming the string selection line SSL and the ground selection line GSL. There may be, for example, three word lines WLD1-WLD3 that are not involved in the storage of information The distance Ds between the respective line SSL, GSL, WLx, and WLDx may be set to the same as the width Dw of each of the respective word lines WLx and WLDx and may be 0.5 times the pitch P of the word lines WLx and WLDx. The number of word lines WLx and WLDx may be odd because double patterning technology is used.

In the present embodiment, the distance Dc4 between the string selection line SSL and the ground selection line GSL may be set to 35.5 times the pitch P of the word lines WLx and WLDx. For example, the distance Dc4 between the string selection line SSL and the ground selection line GSL may be set to a distance that is obtained by adding 0.5 pitches to a number of pitches corresponding to the number of word lines WL1-WL32, which may be involved in the storage of information, and a pitch corresponding to the number of word lines WLD1-WLD3, which need not be involved in the storage of information.

Figure 3B:
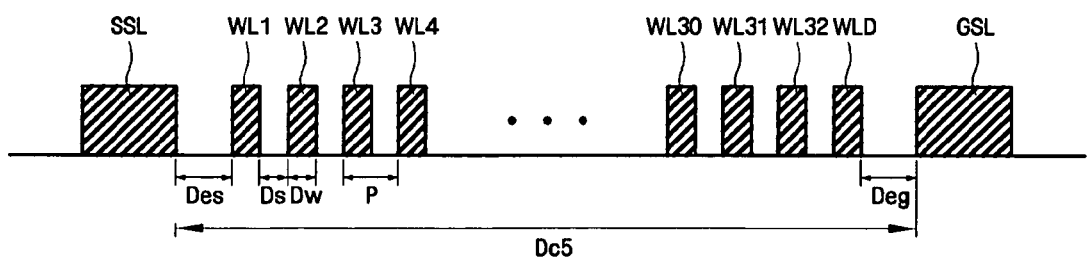

FIG. 3B is a longitudinal section schematically showing the unit string structure of a flash memory device according to another embodiment of the present invention.

Referring to FIG. 3B, the unit string 300b of the flash memory device may include an odd number of word lines WLx located between the string selection line SSL and the ground selection line GSL. The distance Des between the string selection line SSL and a word line WL1 adjacent thereto and the distance Deg between the ground selection line GSL and a word line WLD adjacent thereto may each be greater than the distance Ds between the word lines.

The distance Dc5 between the string selection line SSL and the ground selection line GSL may be set to 34.5 times the pitch P of the word lines WLx and WLD. For example, the distance Dc5 may be set to a value obtained by summing pitches corresponding to the number of word lines WLx and WLD formed between the string selection line SSL and the ground selection line GSL, the widened distances Des and Deg, and the width Dw of one of the word lines WLx and WLD. The widened distances Des and Deg may each be equal to the pitch P of the word lines WLx and WLD. The distance Dc5 may be set to a distance that is obtained by adding 0.5 to a number of pitches corresponding to 'the number of word lines WLx (which are formed between the string selection line SSL and the ground selection line GSL)+2'. For example, the distance Dc5 may be set to a value obtained by summing a number of pitches corresponding to 'the total number of word lines WLx and WLD (which are formed between the string selection line SSL and the ground selection line GSL)–1', the distance Des between the string selection line SSL and a word line WL1 adjacent thereto, the distance Deg between the ground selection line GSL and a word line WLD adjacent thereto, and the width Dw of each of the word lines WLx and WLD.

In any of the embodiments of the present invention, the width Dw of each of the word lines WLx may be greater than the distance Ds between the word lines WLx. In the drawings, the width Dw of each of the word lines WLx and the distance Ds between the word lines WLx are illustrated and described as being the same in order to promote an understanding of the technical spirit of the present invention. The lines SSL, GSL and WLx according to the present embodiment may be formed using the double patterning method. When a mask is formed to pattern the lines, the thickness of each of the lines may be adjusted such that the distance between the lines SSL, GSL and WLx can be adjusted, a description of which is provided below.

Methods of forming patterns of flash memory devices in various ways according to embodiments of the present invention will be fully understood by those skilled in the art with reference to the accompanying drawings. Accordingly, in descriptions given in conjunction with the drawings, portions may be understood by referring to the drawings.

FIGS. 4A to 4J are diagrams illustrating methods of forming unit strings of flash memory devices according to embodiments of the present invention.

Figure 4A:
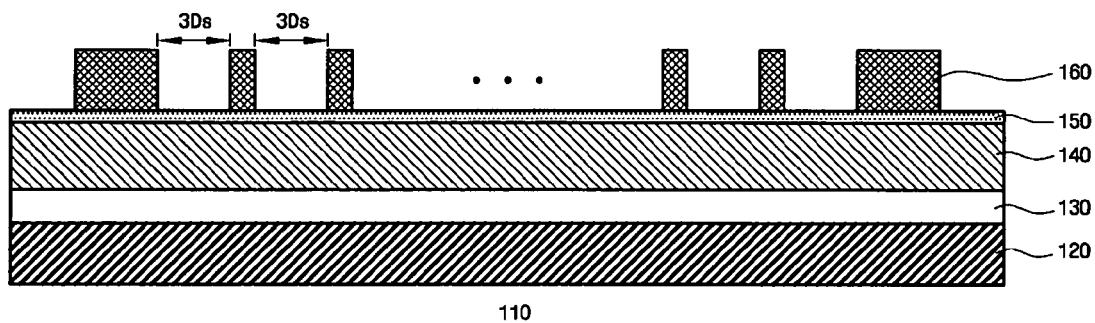
FIGS. 4A to 4J are diagrams illustrating methods of forming the unit strings of flash memory devices according to the first and second embodiments of the present invention.
Figure 4B:
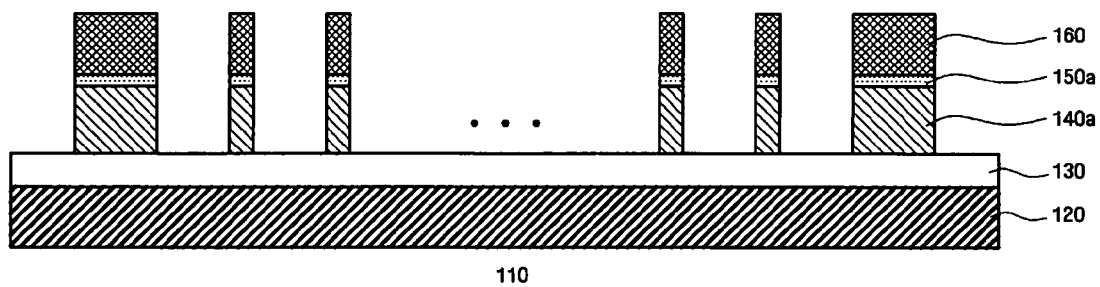
Figure 4C:
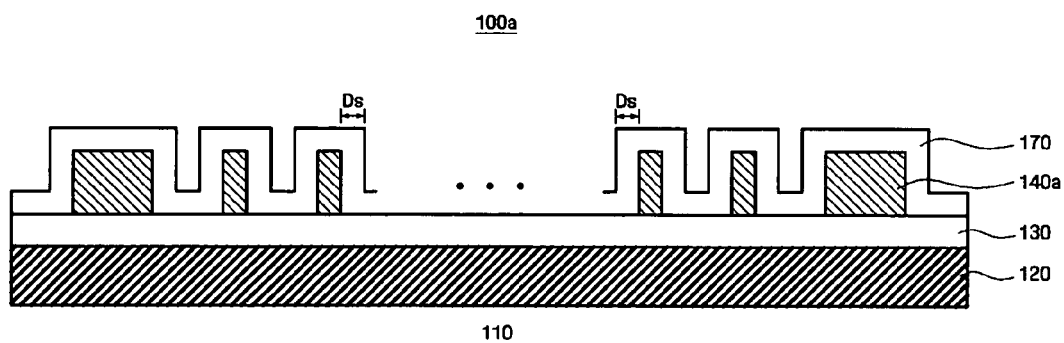
Figure 4D:
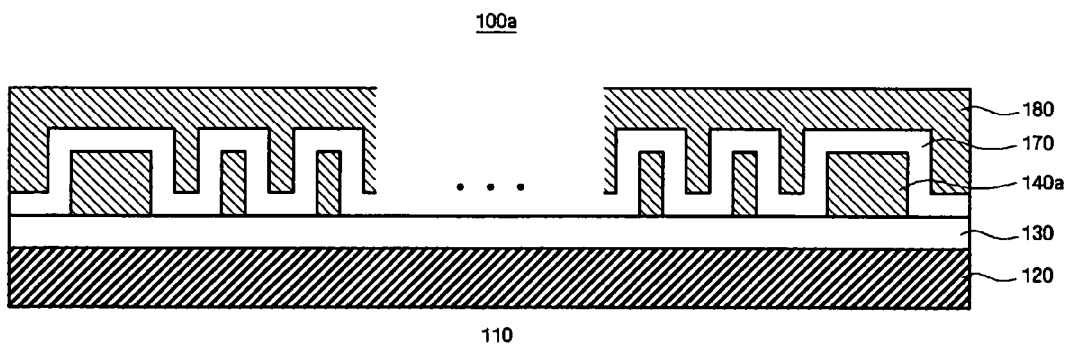
Figure 4E:
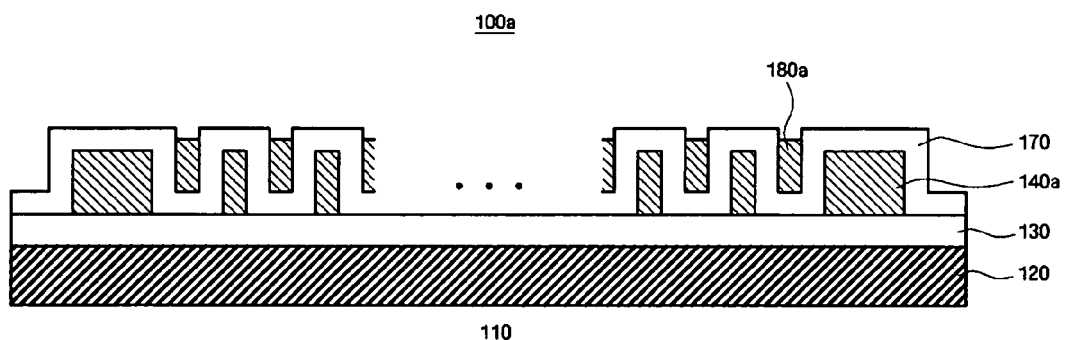
Figure 4F:
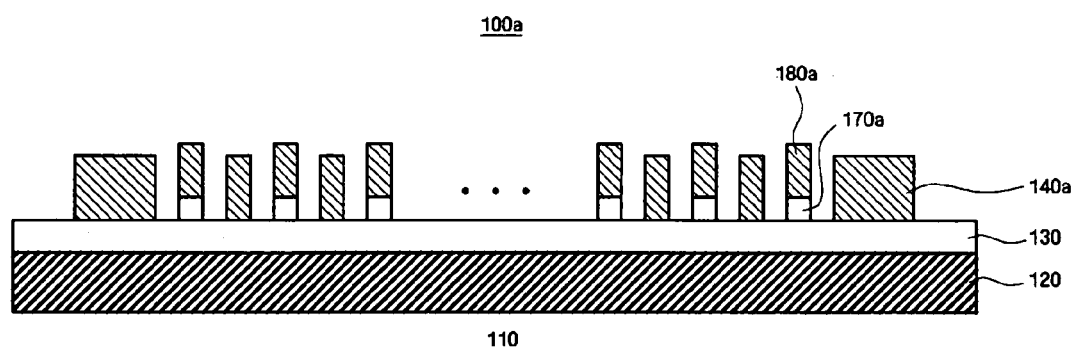
Figure 4G:
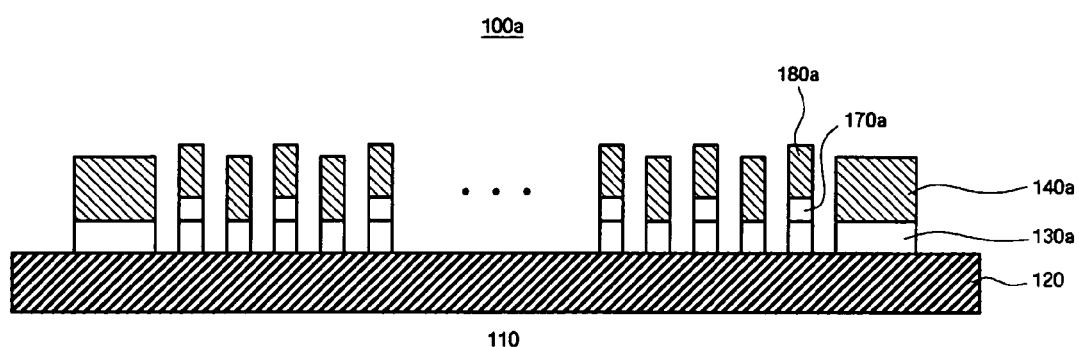
Figure 4H:
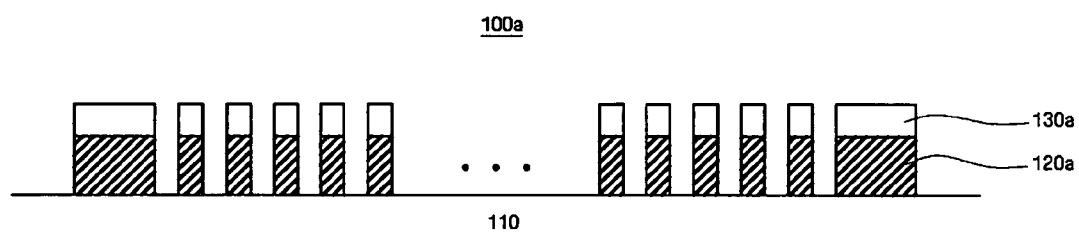
Figure 4I:
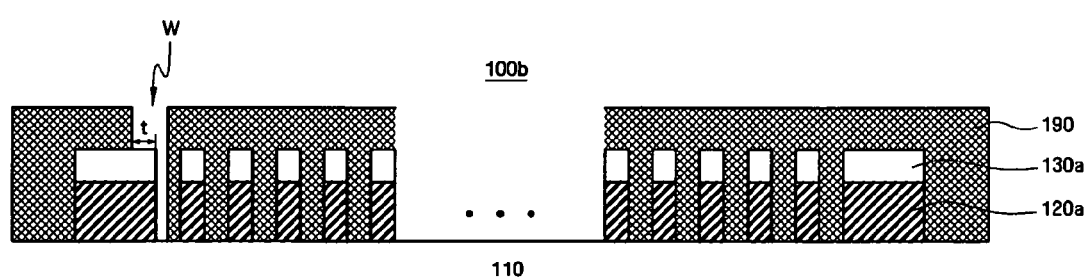
Figure 4J:
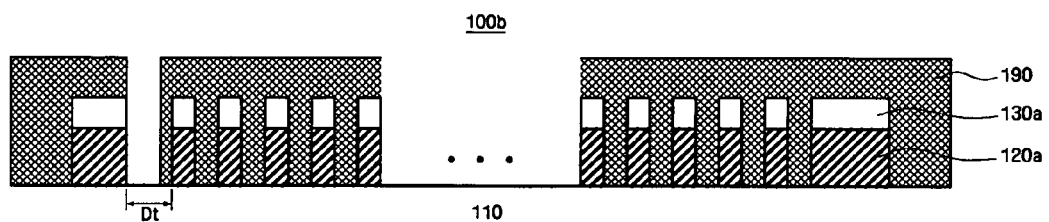

In particular, FIGS. 4A to 4H are diagrams illustrating a method of forming a unit string of a flash memory device according to an embodiment of the present invention, and FIGS. 4I and 4J are diagrams additionally illustrating a method of forming the unit string of a flash memory device according to another embodiment of the present invention.

With reference to FIG. 4A, a conductive layer 120 for forming respective conductive lines may be formed on a substrate 110, a hard mask layer 130 may be formed on the conductive layer 120, a first polysilicon layer 140 may formed on the hard mask layer 130, an anti-reflective layer 150 may be formed on the first polysilicon layer 140, and first photoresist patterns 160 may be formed to pattern the respective lines.

The substrate 110 may be a general well-known semiconductor substrate. For example, a silicon substrate, a silicon-germanium (SiGe) substrate, a silicon on insulator (SOI) substrate, a silicon on sapphire (SOS) substrate and other various types of semiconductor substrates may be used as the substrate 110.

The conductive layer 120 may have a structure in which the gate transistors of the flash memory device may be formed. For example, the conductive layer 120 may have a multi-layer structure in which an insulation layer, a floating gate and a control other than a single material layer gate, may simultaneously be formed.

The hard mask layer 130 may be used as an etching mask for patterning the conductive layer 120. The hard mask layer 130 may be formed of, for example, a silicon nitride film or a silicon oxide nitride film using a Chemical Vapor Deposition method.

The first polysilicon layer 140 may be used as an etching mask for patterning the hard mask layer 130. The first polysilicon layer 140 may be formed, for example, and various films may be applied thereto according to the intention of those who desire to implement the embodiments of the present invention For example, polysilicon may be used as it is a film widely used in processes for manufacturing semiconductor devices.

The anti-reflective layer 150 may be formed of a high polymer organic material or an inorganic material. In the case of forming the anti-reflective layer 150 using a high polymer organic material, the anti-reflective layer 150 may be formed of photoresist or high polymer resin using a coating method. In the case of forming the anti-reflective layer 150 using the inorganic material the anti-reflective layer 150 may be formed of a silicon nitride film or a silicon oxide nitride film.

Since all of the components other than the conductive layer 120 may be removed from the final resultant product, the material formed in the present embodiment and other materials may be used in ways other than those described herein.

The first photoresist patterns 160 may be primarily used as an etching mask for patterning the first polysilicon layer 140. The distance between the first photoresist patterns 160 may be set to three times (3Ds) the distance Ds between the lines SSL, GSL and WLx. The distance between the photoresist patterns 160 may be three times the distance Ds between the lines SSL, GSL and WLx to accommodate double patterning technology. For example, the width Dw of each of the word lines WLx and the distance Ds between the word lines WLx may be set to be the same so that 3Ds may be set to be equal to 3Dw.

With reference to FIG. 4B, an anti-reflective pattern 150a and a first polysilicon pattern 140a may be formed using the first photoresist pattern 160 as an etching mask, and the surface of the hard mask layer 130 may be selectively exposed In the case where the anti-reflective layer 150 (FIG. 4A) is formed of a high polymer organic material, the anti-reflective pattern 150a may be formed at the step of FIG. 4A. For example, the anti-reflective pattern 150a may be formed simultaneously with the forming of the first photoresist patterns 160. In the case where the anti-reflective layer 150 (FIG. 4A) is formed of an inorganic material, for example, a silicon nitride film or a silicon oxide nitride film, an etching process may be performed using the first photoresist patterns 160 as an etching mask and the anti-reflective layer 150 (FIG. 4A) may be patterned. Thereafter, the first polysilicon layer 140 (FIG. 4A) may be etched, and thus the first polysilicon pattern 140a may be formed.

Referring to FIG. 4C, after the first photoresist patterns 160 (FIG. 4B) and the anti-reflective pattern 150a (FIG. 4B) are removed, a silicon oxide film 170 may be formed on the surface of the first polysilicon pattern 140a and the exposed portions of the hard mask layer 130. The silicon oxide film 170 may be formed such that the thickness of the silicon oxide film 170 formed on a side surface of the first polysilicon pattern 140a is the same as the distance Ds between the lines SSL, GSL and WLx.

With reference to FIG. 4D, a second polysilicon layer 180 may be formed on the silicon oxide film 170. The second polysilicon layer 180 may be formed by being disposed between the portions of the silicon oxide film 170, for example, in accordance with methods known in the art.

With reference to FIG. 4E, the second polysilicon layer (not shown) may be etched, and thus second polysilicon patterns 180a may be formed. The second polysilicon patterns 180a may be formed between the portions of the silicon oxide film 170, and may be formed to be slightly lower than the top of the silicon oxide film 170. The second polysilicon patterns 180a may be formed, for example, using either a dry etching method or a wet etching method. The second polysilicon patterns 180a may be formed, for example, in accordance with methods known in the art.

With reference to FIG. 4F, the exposed silicon oxide film 170 (FIG. 4E) may be vertically removed, and thus silicon oxide layer patterns 170a remaining under the respective second polysilicon patterns 180a may be formed. In this case, the second polysilicon patterns 180a may be left behind without being removed, and the surfaces of the first polysilicon pattern 140 (FIG. 4A) and the hard mask layer 130 may be selectively exposed.

With reference to FIG. 4G, the exposed hard mask layer 130 (FIG. 4F) may be etched using the exposed first polysilicon patterns 140a and second polysilicon pattern 180a as an etching mask, and thus hard mask patterns 130a that selectively expose the upper surface of the conductive layer 120 may be formed. The hard mask 130 (FIG. 4F) may be etched according to methods known in the art.

With reference to FIG. 4H, the conductive layer 120 (FIG. 4G) may be etched using the hard mask pattern 130a as an etching mask and thus conductive patterns 120a may be formed. Thereafter, the hard mask pattern 130a may be removed, and therefore the unit string of the flash memory device, shown in FIG. 1A, according to an embodiment of the present invention may be formed. The hard mask pattern 130a may be removed according to methods known in the art.

With reference to FIG. 4I, a second photoresist pattern 190 having a window W may be formed to trim a portion of the string selection line SSL after the step shown in FIG. 4H. The window W may be formed such that a portion t of the string selection line SSL is exposed.

With reference to FIG. 4J, the string selection line SSL may be trimmed to achieve the desired distance Dt between the string selection line SSL and a word line adjacent thereto. The string selection line SSL may be trimmed, for example, using an etching process of removing the exposed hard mask pattern and conductive layer pattern 130a and 120a. Thereafter, the second photoresist pattern 190 may be removed, and therefore the unit string of the flash memory device, shown in FIG. 1B, according to an embodiment of the present invention may be formed.

In the method of forming the unit string of the flash memory device, shown in FIGS. 4A to 4J, according to an embodiment of the present invention, when the distance Ds, corresponding to the thickness of the silicon oxide film 170 (FIG. 4E), is not set to be the same as the width Dw of each of the word lines WLx but is set to be smaller than the width, the distance Ds between the word lines WLx may be less than the width of each of the lines SSL, GSL and WLx. For example, when the distance Ds, corresponding to the thickness of the silicon oxide film 170 (FIG. 4E), is set to be equal to ½ Dw and the distance between the word lines WLx obtained by patterning the first polysilicon layer 140 is equal to 2Dw, the distance Ds between the respective lines SSL, GSL and WLx may be set to half of the width Dw of each of the word lines WLx. In this case, 2Dw may be equal to 4Ds. For example, as seen in FIG. 4A, the distance between first photoresist patterns 160 is not set to 3Ds but is set to 4Ds.

FIGS. 5A to 5H are diagrams illustrating a method of forming the unit string of the flash memory device according to an embodiment of the present invention.

Figure 5A:
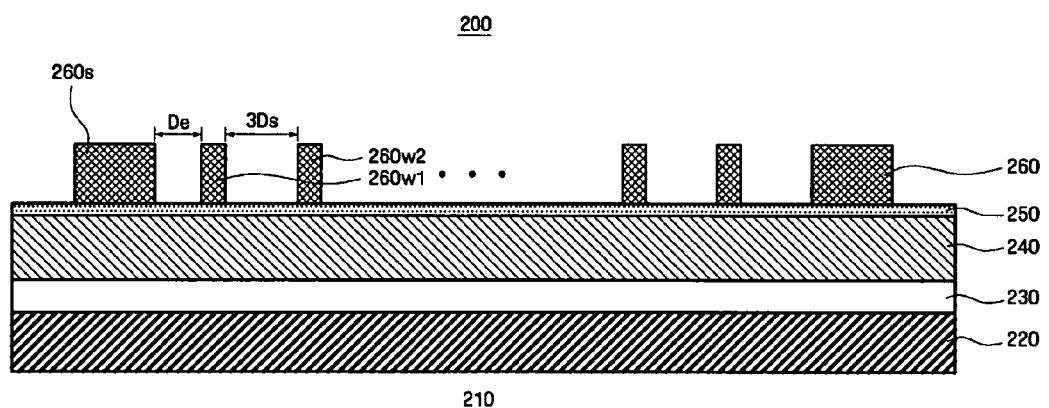
FIGS. 5A to 5H are diagrams illustrating a method of forming the unit string of a flash memory device according to the third embodiment of the present invention.

With reference to FIG. 5A, a conductive layer 220 may be formed on a substrate 210, a hard mask layer 230 may be formed on the conductive layer 220, a first polysilicon layer 240 may be formed on the hard mask layer 230, an anti-reflective layer 250 may be formed on the first polysilicon layer 240, and photoresist patterns 260 may be formed on the anti-reflective layer 250. The method of forming the respective components may be understood with reference to FIG. 4A and the above description thereof. The distance De between photoresist patterns 260s for forming the string selection line SSL and photoresist patterns 260w1 for forming a word line WL1 adjacent to the string selection line SSL may be the same as the distance De shown in FIG. 1, and the distance 3Ds between photoresist patterns 260w1 and 260w2 for forming the word lines WLx may be set to three time the distance Ds between the respective word lines WLx. The distance between respective photoresist patterns 260x may be set to De or 3Ds to accommodate the use of double patterning technology.

Figure 5B:
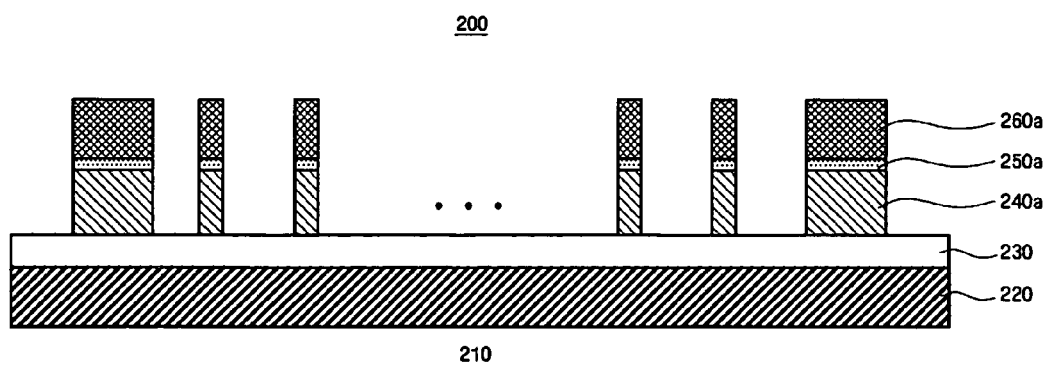

With reference to FIG. 5B, the anti-reflective layer 250 (FIG. 5A) and the first polysilicon layer 240 (FIG. 5A) may be patterned using the photoresist patterns 260 (FIG. 5A) as an etching mask, and thus anti-reflective layer patterns 250a and first polysilicon patterns 240a may be formed. The surface of the hard mask layer 230 may be selectively exposed. FIG. 5B may be further understood with reference to FIG. 4B and the above description thereof.

Figure 5C:
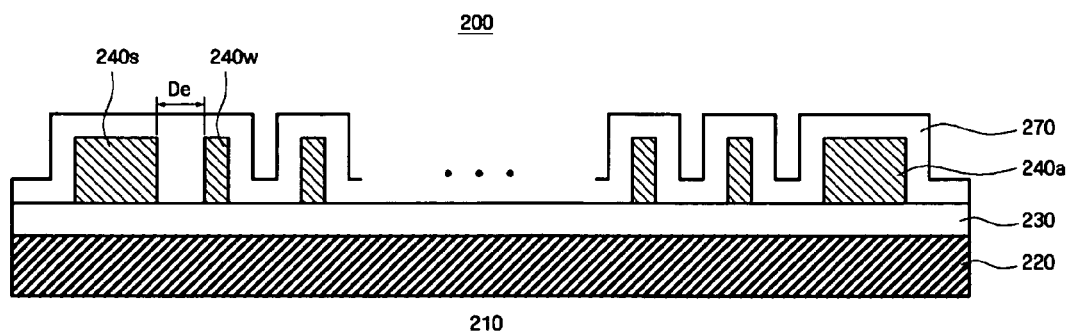

With reference to FIG. 5C, a silicon oxide film 270 may be formed on the surfaces of the first polysilicon pattern 240a and the exposed portions of the hard mask layer 230. FIG. 5C may be further understood with reference to FIG. 4C and the above description thereof. In this case, no space need be formed between the first polysilicon pattern 240s for forming the string selection line SSL and the first polysilicon pattern 240w for forming the word line WL1, unlike the case described above with reference to FIG. 4C. This is because the silicon oxide film 270 may be formed on the side surface of the respective first polysilicon patterns 240a to a thickness corresponding to Ds.

Figure 5D:
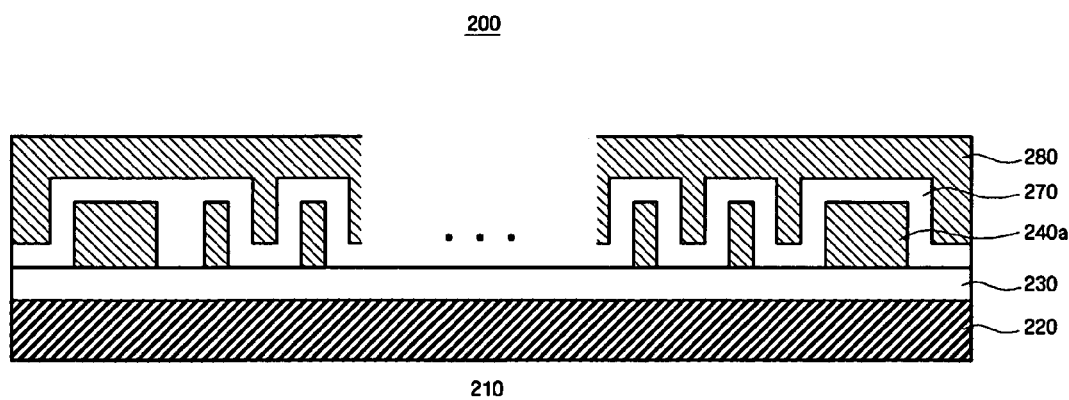

With reference to FIG. 5D, a second polysilicon layer 280 may be formed on the silicon oxide film 270. FIG. 5D may be further understood with reference to FIG. 4D and the above description thereof.

Figure 5E:
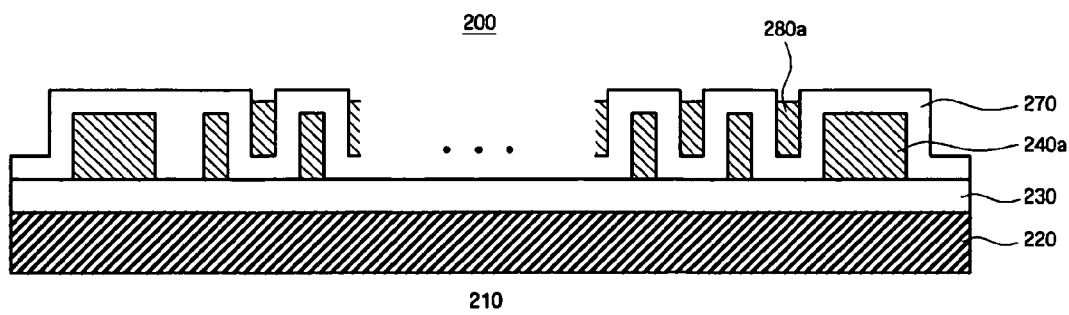

With reference to FIG. 5E, the second polysilicon layer 280 (FIG. 5D) may be etched, and thus second polysilicon patterns 280a may be formed. FIG. 5E may be further understood with reference to FIG. 4E and the above description thereof.

Figure 5F:
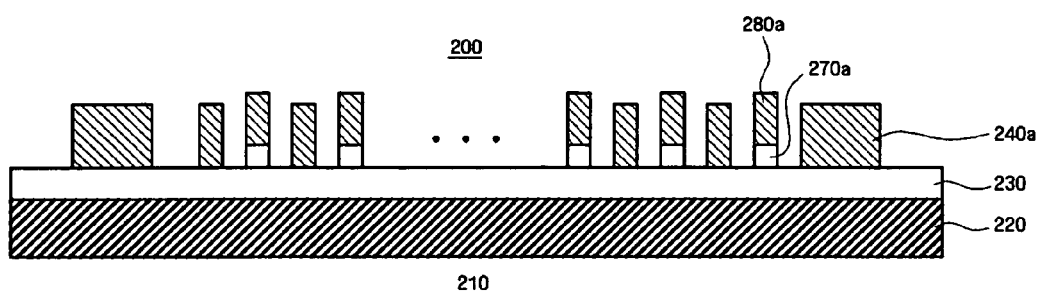

With reference to FIG. 5F, the exposed silicon oxide film 270 (FIG. 5E) may be vertically removed, and thus the surfaces of the first polysilicon patterns 240a, the second polysilicon patterns 280a and the hard mask layer 230 may be selectively exposed. FIG. 5F may be further understood with reference to FIG. 4F and the above description thereof.

Figure 5G:
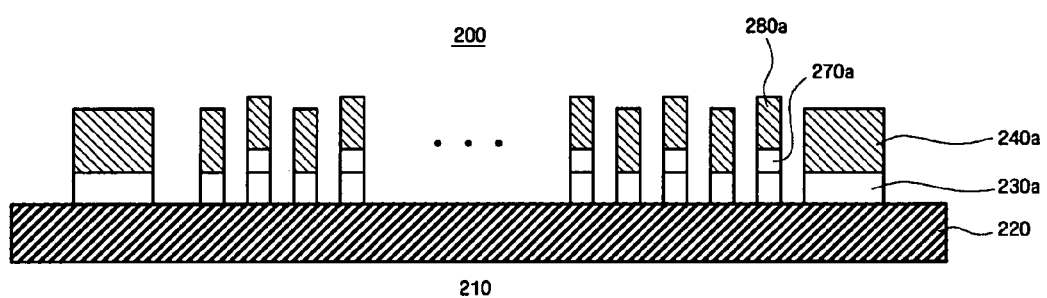

With reference to FIG. 5G, the surface of the exposed hard mask layer 230 (FIG. 5F) may be vertically etched, and thus hard mask patterns 230a may be formed such that the surface of the conductive layer 220 is selectively exposed. FIG. 5G may be further understood with reference to FIG. 4G and the above description thereof.

Figure 5H:
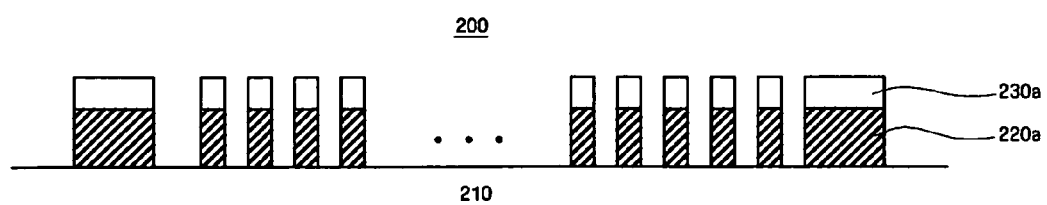

With reference to FIG. 5H, the first polysilicon patterns 240a (FIG. 5G), the second polysilicon patterns 280a (FIG. 5G), and the silicon oxide film patterns 270a (FIG. 5G) formed under the second polysilicon patterns 280a (FIG. 5G) may be removed, then the conductive layer 220 (FIG. 5G) may be patterned using the hard mask pattern 230a as an etching mask and thus conductive layer patterns 220a may be formed. Thereafter, the hard mask patterns 230a may be removed, and the unit string of the flash memory device, shown in FIG. 2, according to an embodiment of the present invention may be formed. The conductive layer patterns 220a may form the string selection line SSL, the ground selection line GSL and the word lines WLx.

In the method of forming the unit string of the flash memory device, shown in FIGS. 5A to 5H, according to the embodiment of the present invention, when the distance Ds, corresponding to the thickness of the silicon oxide film 270 (FIG. 5E), is not set to be the same as the width Dw of each of the word lines WLx and is set to be smaller than the width, the distance Ds between the word lines WLx may be less than the width of each of the lines SSL, GSL and WLx. For example, when the distance Ds, corresponding to the thickness of the silicon oxide film 270 (FIG. 5E), is set to be equal to ½ Dw, the distance Ds between the respective lines SSL, GSL and WLx may be set to half of the width of each of the word lines WLx.

FIGS. 6A to 6F are diagrams illustrating a method of forming the unit string structure of the flash memory device, shown in FIG. 3B, according to an embodiment of the present invention.

Figure 6A:
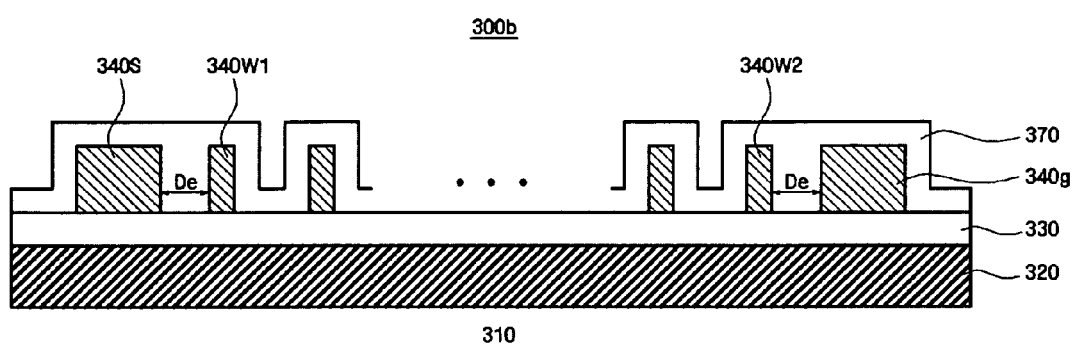
FIGS. 6A to 6F are diagrams illustrating a method of forming the unit string of a flash memory device according to the fifth embodiment of the present invention.

With reference to FIG. 6A, a conductive layer 320 may be formed on a substrate 310, a hard mask layer 330 may be formed on the conductive layer 320, first polysilicon patterns 340 (it is to be understood that the reference numeral 340 refers generally to the set of patterns with reference numerals beginning with the number 340, for example, 340S, 340W1, 340W2, and 340Wg) may be formed on the hard mask layer 330, and a silicon oxide film 370 may be formed on the first polysilicon patterns 340 and the selectively exposed hard mask layer 330. FIG. 6A may be further understood with reference to FIGS. 4C and 5C and the above descriptions thereof. In this case, the distance between a first polysilicon pattern 340S for forming the string selection line SSL and a first polysilicon pattern 340W1 for forming a word line WLx adjacent to the string selection line SSL and the distance between a first polysilicon pattern 340g for forming the ground selection line GSL and a first polysilicon pattern 340W2 for forming a word line adjacent to the ground selection line GSL may be set to De. The distance De may be two times the distance Ds between the respective lines SSL, GSL and WLx.

Figure 6B:
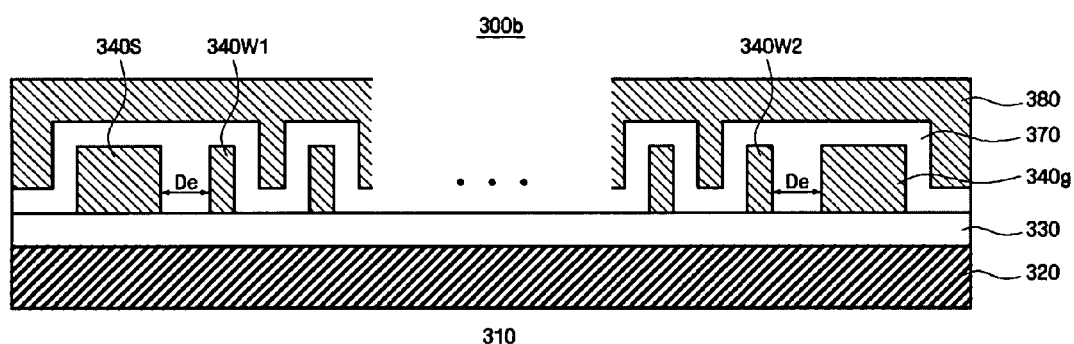

With reference to FIG. 6B, a second polysilicon layer 380 may be formed on the silicon oxide film 370. FIG. 6B may be further understood with reference to FIGS. 4D and 5D and the above descriptions thereof. In this case, the polysilicon layer 380 need not formed in region De.

Figure 6C:
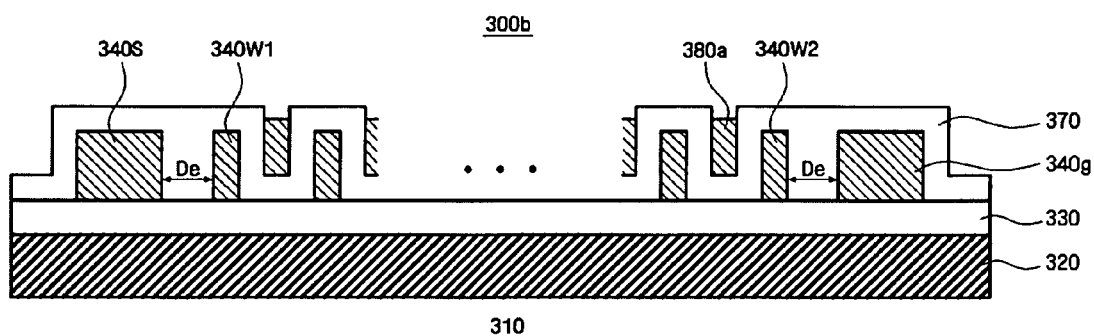

With reference to FIG. 6C, the second polysilicon layer 380 (FIG. 6B) may be etched, and thus second polysilicon patterns 380a may be formed FIG. 6C may be further understood with reference to FIGS. 4E and 5E and the above descriptions thereof.

Figure 6D:
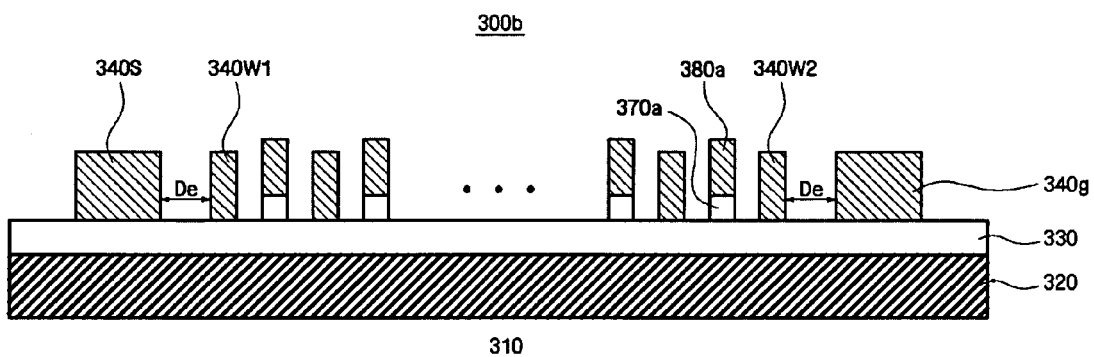

With reference to FIG. 6D, the exposed silicon oxide film 370 (FIG. 6C) may be vertically etched, and thus the surfaces of the first polysilicon patterns 340, the second polysilicon patterns 380a and the hard mask layer 330 may be selectively exposed. FIG. 6D may be further understood with reference to FIGS. 4F and 5F and the above descriptions thereof.

Figure 6E:
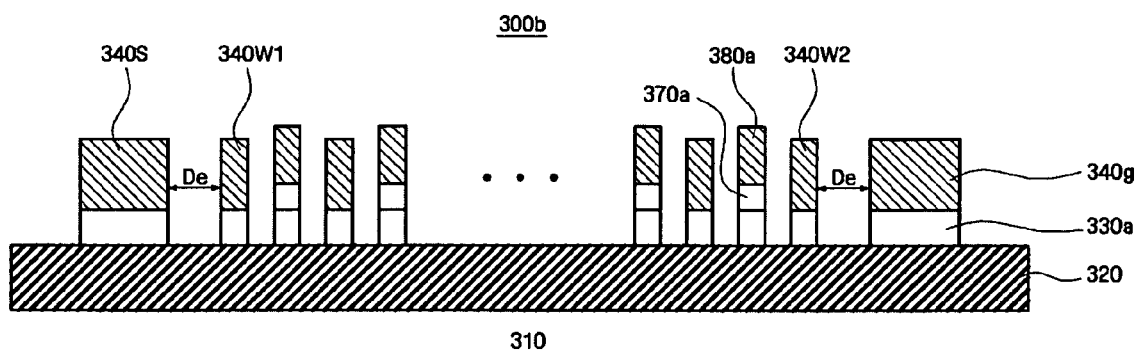

With reference to FIG. 6E, the hard mask layer 330 (FIG. 6D) may be etched using the first polysilicon patterns 340 and the second polysilicon patterns 380a as an etching mask, and thus hard mask patterns 330a may be formed. FIG. 6E may be further understood with reference to FIGS. 4G and 5G and the above descriptions thereof.

Figure 6F:
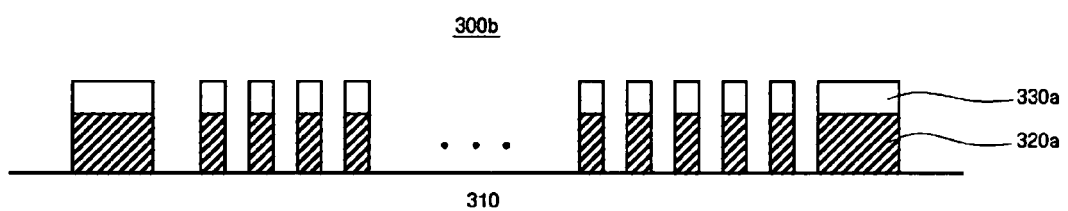

With reference to FIG. 6F, the first polysilicon patterns 340 (FIG. 6D), the second polysilicon patterns 380a (FIG. 6D), and silicon oxide film patterns 370a (FIG. 6D) formed under the respective second polysilicon patterns 380a (FIG. 6E) may be removed, then the conductive layer 320 (FIG. 6E) may be patterned using the hard mask patterns 330a as an etching mask and thus conductive layer patterns 320a may be formed. Thereafter, the hard mask patterns 330a may be removed, and therefore the unit string of a flash memory device, shown in FIG. 3B, according to an embodiment of the present invention may be formed. The conductive layer patterns 320a may form the string selection line SSL, the ground selection line GSL and the word lines WLx.

In the method of forming the unit string of a flash memory device, shown in FIGS. 6A to 6F, according to an embodiment of the present invention, when the distance Ds corresponding to the thickness of the silicon oxide film 370 (FIG. 6C) is not set to be the same as the width Dw of each of the word lines WLx but is set to be smaller than the width, the distance Ds between the word lines WLx may be less than the width of each of the lines SSL, GSL and WLx. For example, when Ds, which corresponds to the thickness of the silicon oxide film 370 (FIG. 6C), is set to ½ Dw, the distance Ds between the respective lines SSL, GSL and WLx may be set to half of the width of each of the word lines WLx.

In addition, if, in any of the embodiments of the present invention, the distances between the first polysilicon layers 140 (FIG. 4A), 240 (FIG. 5A) and 340 (FIG. 6A) and the thickness of each of the silicon oxide films 170, 270 and 370 are adjusted, the word lines WLx having various types of distances may be formed.

As described above, in accordance with various types of flash memory devices and methods of manufacturing the same according to the embodiments of the present invention, fine patterns can be formed using double patterning technology and the distances between patterns may be assured to realized stable operation from the point of view of device operation, so that the degree of integration of the semiconductor device can be increased.

Although embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a flash memory device, the method comprising:
    forming a conductive layer on a substrate;
    forming a hard mask layer on the conductive layer;
    forming a first material layer on the hard mask layer;
    forming photoresist patterns on the first material layer;
    forming first material patterns, which selectively exposes a surface of the hard mask layer, through patterning using the photoresist patterns as an etching mask;
    removing the photoresist patterns;
    forming a second material layer on the first material patterns and the hard mask layer, the surface of which is selectively exposed;
    forming a third material layer on the second material layer;
    forming third material patterns, which is formed to expose an upper surface of the second material layer existing between portions of the second material layer, through patterning;
    selectively exposing surfaces of the first material patterns, the third material patterns and the hard mask layer by vertically removing the second material layer, the upper portion of which is exposed, thus forming second material patterns remaining only under the third material patterns;
    forming hard mask patterns through patterning of the hard mask layer, the surface of which has been selectively exposed, using the first material patterns and the third material patterns as an etching mask;
    removing the first material patterns, the second material patterns and the third material patterns;
    forming conductive patterns through patterning of the conductive layer using the hard mask patterns as an etching mask; and
    removing the hard mask patterns.

2. The method of claim 1, wherein the formed conductive patterns comprise a string selection line, a ground selection line, and a plurality of word lines formed between the string selection line and the ground selection line.

3. The method of claim 2, wherein a width of each of the word lines is formed to be greater than a distance between a pair of adjacent word lines.

4. The method of claim 3, wherein there are an odd number of word lines.

5. The method of claim 3, wherein a distance between the string selection line and a word line adjacent to the string selection line is equal to two times the distance between a pair of adjacent word lines.

6. The method of claim 3, wherein a distance between the ground selection line and a word line adjacent to the ground selection line is equal to two times the distance between a pair of adjacent word lines.

7. The method of claim 2, further comprising, after forming the first material pattern, removing the word line adjacent to the string selection line or removing the word line adjacent to the ground selection line.

8. The method of claim 1, wherein both the first material layer and the third material layer comprise silicon.

9. The method of claim 1, wherein the second material layer comprises silicon oxide.

10. The method of claim 1, wherein the hard mask layer comprises a silicon nitride material or a silicon oxide nitride material.

11. A method of manufacturing a flash memory device, the method comprising:
    forming first mask patterns for forming a string selection line, a ground selection line, and more than half of a plurality of word lines to be formed between the string selection line and the ground selection line;
    forming second mask patterns for forming word lines of the plurality of word lines that are not formed by the first mask pattern between the first mask patterns; and
    forming the string selection line, the ground selection line and the plurality of word lines using the first mask patterns and the second mask patterns as a patterning mask,
    wherein a width of each of the word lines is greater than a distance between a pair of adjacent word lines,
    wherein there are an odd number of word lines and the first mask patterns comprise a first number of patterns for forming word lines and the second mask patterns comprise a second number of patterns for forming word lines,
    wherein the first number is equal to the second number plus one, and
    wherein a distance between the string selection line and a word line adjacent to the string selection line is equal to two times the distance between a pair of adjacent word lines.

12. The method of claim 11, wherein a distance between the ground selection line and a word line adjacent to the ground selection line is equal to two times the distance between a pair of word lines.

* * * * *